United States Patent [19]
Millman

[11] Patent Number: 5,410,548
[45] Date of Patent: Apr. 25, 1995

[54] TEST PATTERN FAULT EQUIVALENCE

[75] Inventor: Steven D. Millman, Mesa, Ariz.

[73] Assignee: Motorola, Inc., Schaumburg, Ill.

[21] Appl. No.: 967,311

[22] Filed: Oct. 28, 1992

[51] Int. Cl.$^6$ ............................................. G01R 31/28
[52] U.S. Cl. ...................................... 371/23; 371/26; 371/27; 324/73.1
[58] Field of Search .................... 371/22.1, 23, 26, 27; 324/73.1

[56] References Cited

U.S. PATENT DOCUMENTS

| | | | |
|---|---|---|---|
| 4,228,537 | 10/1980 | Henckels et al. | 371/23 |
| 4,763,289 | 8/1988 | Brazilai et al. | 364/200 |
| 5,084,876 | 1/1992 | Welham et al. | 371/23 |

OTHER PUBLICATIONS

Acken et al. 'Fault model evolution for diagnosis:accuracy vs precision' May 1992 pp. 13.4.1–13.4.4
Millman et al. 'An accurate fault test pattern generator' Oct. 1991 pp. 411–418.

Primary Examiner—Emanuel T. Voeltz
Assistant Examiner—Craig Miller
Attorney, Agent, or Firm—Harry A. Wolin

[57] ABSTRACT

A method for determining test pattern fault equivalence. The method comprises selecting a bridging fault (16) from a digital circuit, then determining a stuck-at fault (17) which guarantees detection of the bridging fault. Generation of a test vector (18) which detects the stuck-at fault. Simulating the test vector (19) to find all bridging faults that are detected by the test vector, and repeating the above steps until the desired percentage of detectable bridging faults are examined.

8 Claims, 1 Drawing Sheet

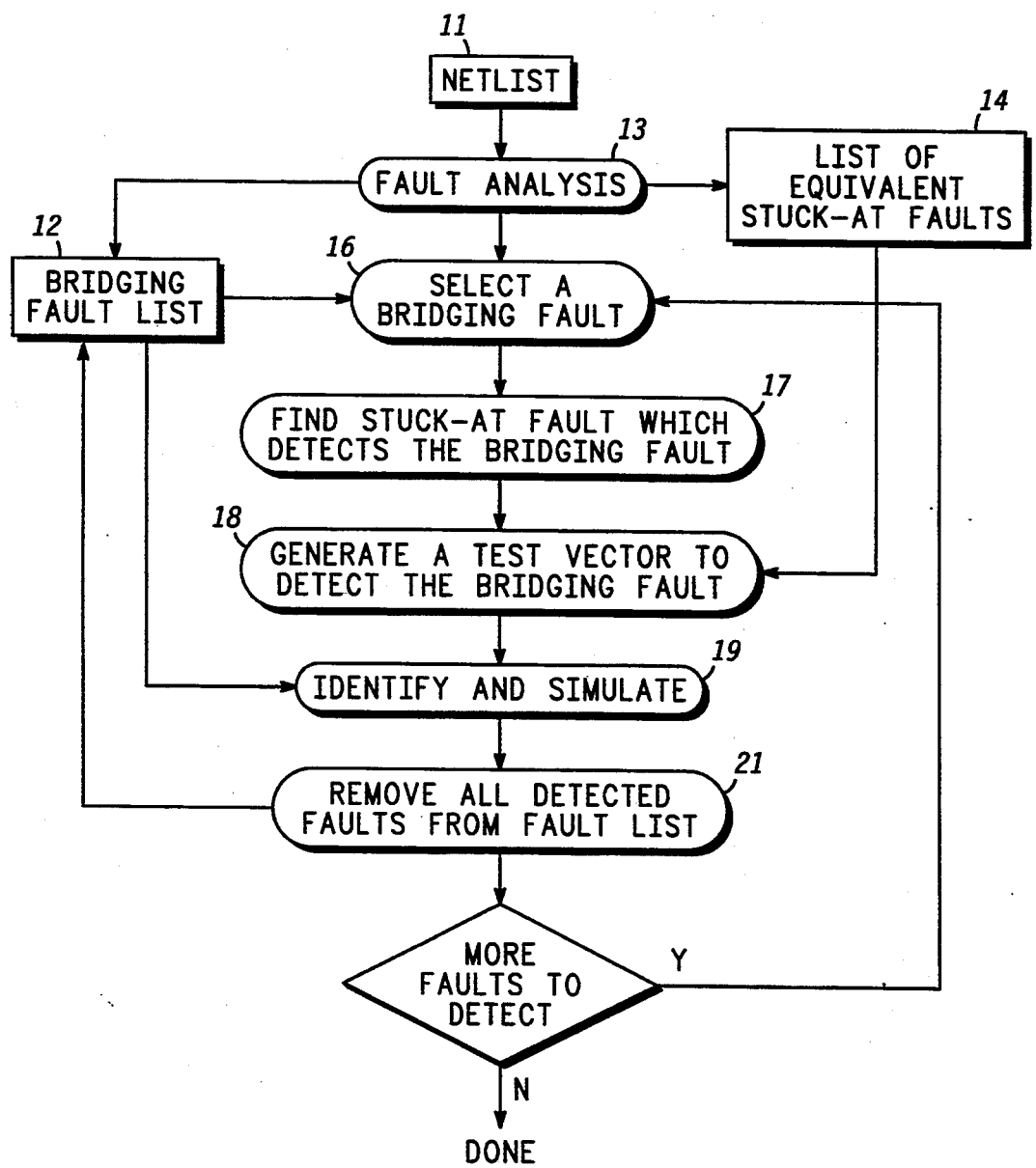

TEST PATTERN FAULT EQUIVALENCE

FIELD OF THE INVENTION

The present invention is related to a co-pending application entitled "Test Pattern Generation", filed on even date herewith, by S. Millman and J. Garvey, which is incorporated herein by reference. This co-pending application is assigned to the same assignee as the present invention.

BACKGROUND OF THE INVENTION

The present invention relates, in general, to testing of digital circuits, and more particularly to minimization of test patterns used to detect faults in digital circuits.

When undertaking test pattern generation and fault simulation, the number of faults that must be considered is typically smaller than the number of faults in the fault list. For stuck-at faults, the number of faults to be considered is typically reduced by using the concept of fault equivalence. Two faults are equivalent if all of the input vectors that can detect one of the faults can also detect the other. Using this idea, the number of faults that must be considered can be drastically reduced before the test generation process begins. This approach works well for stuck-at faults since such relationships between stuck-at faults are easy to derive and do not change with applied test vectors. Unfortunately, these relationships are quite difficult to derive for bridging faults.

There is a need for a method to reduce the number of faults which must be considered when generating test vectors to test for bridging faults. The method must be simple, easy to use, and must not require excessive computer time. Ideally, the method should take advantage of information that is already derived for other uses thus requiring very little extra overhead to implement.

SUMMARY OF THE INVENTION

Briefly stated, the present invention provides a method for determining test pattern fault equivalence. The method comprises selecting a bridging fault from a digital circuit, then determining a stuck-at fault that guarantees detection of the bridging fault. Generating a test vector to detect the stuck-at fault. Simulating the test vector to find all bridging faults that are detected by the test vector, and repeating the above steps until the desired percentage of detectable bridging faults are examined.

BRIEF DESCRIPTION OF THE DRAWINGS

FIG. 1 shows a flow chart depicting a method for determining test pattern fault equivalence, as a preferred embodiment in accordance with the present invention.

DETAILED DESCRIPTION OF THE DRAWINGS

FIG. 1 shows a flow chart depicting a method for determining test pattern fault equivalence, as a preferred embodiment in accordance with the present invention. A netlist 11, comprising a list of circuit components and interconnections between those components, is typically used to define the functionality of a digital circuit. A fault analysis 13 is performed using the information found in netlist 11. Fault analysis 13 derives a list of equivalent stuck-at faults 14 and a bridging fault list 12. List of stuck-at faults 14 is typically minimized using fault equivalence methods well known in the art. A selection step 16 selects a specific bridging fault from bridging fault list 12. A bridging fault is detected by forcing opposite values on the two nodes that are joined by the fault. A strength check is performed on the gates that drive the two nodes to determine the resulting state of the faulty node. In this way, a detection step 17 finds a stuck-at fault whose detection guarantees detection of the bridging fault.

A method for determining the stuck-at fault that is equivalent to a bridging fault is described in a paper "Diagnosing CMOS Bridging Faults with Stuck-at Fault Dictionaries", Millman et al., Proceedings of the International Test Conference, Washington D.C., September 1990, Pages 860–870, which is incorporated herein by reference. This paper is directed to the relationship between stuck-at fault detection and bridging fault detection, and includes methods for deriving the various relationships. The fault-free values on the potentially faulty nodes are forced to be different so as to detect the bridging fault. As a result, only one of the two nodes is forced to an incorrect value due to the bridging fault. The gate driving the node with the incorrect value is outvoted by the gate driving the node with the fault-free value. The circuit thus behaves exactly as if there is a stuck-at fault at the outvoted node. The bridging fault will be detected at all of the primary outputs where the stuck-at fault on the outvoted node is detected by the test vector. In other words, the test vector used to detect the stuck-at fault on the weak or "losing" gate will also detect the bridging fault. Thus detection of the stuck-at fault will guarantee detection of this bridging fault.

A test vector generation 18 generates a test vector that detects the bridging fault by forcing different values on the two nodes of the potential bridging fault. If it is determined that the bridging fault produces a circuit which would oscillate or could be latched by a previous vector when the test vector is applied, more test vectors are tried. Test vector generation 18 continues until either a valid test vector is found or the fault is determined to be undetectable. Test vector generation 18 also simulates the internal logic states produced by the test vector. An identification and simulation 19 is used to determine remaining bridging faults that might be detected by that test vector. A check is made for each potential bridging fault. Those potential bridging faults that have opposite values on the two nodes as a result of the test vector might be detected. At the same time, for each bridging fault, identification and simulation 19 is used to identify a stuck-at fault whose detection guarantees detection of the bridging fault. All of the bridging faults whose detection is guaranteed by detection of the same stuck-at fault, as well as the stuck-at fault itself, are termed "test pattern equivalent". After all of the test pattern equivalent faults have been determined, each identified stuck-at fault is simulated. If the stuck-at fault is detected, then all test pattern equivalent bridging faults are detected. A removal step 21 removes all detected faults, including test pattern equivalent faults from bridging fault list 12. If bridging fault list 12 is empty then the optimization process is completed, otherwise another selection step 16 is performed and the process repeated until at least the desired coverage of faults is achieved.

By now it should be clear that the present invention provides a method to reduce the number of faults that must be considered when generating test vectors to test for bridging faults. The method is simple, easy to use, and does not require excessive computer time. The method takes maximum advantage of information that is already derived for other tasks thus requiring very little extra overhead to implement.

I claim:

1. A method for determining test pattern fault equivalence, comprising:
   providing a digital circuit to be tested;
   selecting a fault of a first fault type from the digital circuit;
   generating a test vector;
   determining a fault of a second fault type which guarantees detection of the fault of the first fault type; and
   simulating the test vector to find all remaining faults that are detected by the test vector.

2. The method for determining test pattern fault equivalence of claim 1 wherein digital circuit to be tested is a digital integrated circuit.

3. The method for determining test pattern fault equivalence of claim 1 further comprising:
   selecting a minimum set of test vectors which will test a predetermined percentage of detectable faults in the digital circuit;
   providing a physically complete device which includes the digital circuit; and
   testing the physically complete device using the minimum set of test vectors.

4. The method for determining test pattern fault equivalence of claim 1 wherein the step of providing a digital circuit to be tested comprises providing a computer readable netlist file and a corresponding fault model which together define the digital circuit.

5. The method for determining test pattern fault equivalence of claim 1 further comprises:
   testing the first fault type for creation of a feedback loop;
   testing the feedback loop to determine whether the bridging fault is detectable with the test vector;
   generating an alternative test vector if the bridging fault is not detected with the test vector; and
   repeating the steps of testing the bridging fault, and testing the feedback loop until a test vector is found to detect the bridging fault or, in the alternative, the bridging fault is determined to be undetectable.

6. An apparatus for determining test pattern fault equivalence, comprising:
   a netlist which defines an integrated circuit to be tested;
   a test vector;
   a potential bridging fault within the integrated circuit which has not yet been detected;
   analysis means for finding a stuck-at fault which guarantees detection of the potential bridging fault; and
   simulation means for determining if the stuck-at fault is detected.

7. A method for determining test pattern fault equivalence, comprising:
   providing a netlist which defines an integrated circuit to be tested;
   building a list of stuck-at faults which are determined to be fault equivalent for the digital circuit;
   deriving a test vector;
   determining a stuck-at fault which guarantees detection of the potential bridging fault for a potential bridging fault within the integrated circuit;
   determining if the stuck-at fault is detected;
   verifying that the test vector continues to detect the bridging fault; and repeating the steps of deriving a test vector, determining a bridging fault, determining a stuck-at fault that guarantees detection of the bridging fault, verifying the test vector, and simulating the test vector until predetermined fraction of detectable bridging faults are examined.

8. A method for determining test pattern fault equivalence, comprising:
   providing a digital circuit to be tested;
   selecting a fault of a first fault type from the digital circuit;
   generating a test vector;
   determining a fault of the second fault type such that detection of the fault of the second fault type guarantees detection of the fault of the first fault type; and
   simulating the fault of the second fault type to determine if the fault of the second fault type is detected by the test vector.

* * * * *